(12) United States Patent
Kim

(10) Patent No.: US 11,550,497 B2
(45) Date of Patent: Jan. 10, 2023

(54) MEMORY SYSTEM AND OPERATING METHOD OF THE MEMORY SYSTEM

(71) Applicant: SK hynix Inc., Gyeonggi-do (KR)

(72) Inventor: Hyun Tae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/368,409

(22) Filed: Jul. 6, 2021

(65) Prior Publication Data

US 2022/0214831 A1 Jul. 7, 2022

(30) Foreign Application Priority Data

Jan. 7, 2021 (KR) .......................... 10-2021-0002201

(51) Int. Cl.
*G06F 3/06* (2006.01)

(52) U.S. Cl.
CPC ............ *G06F 3/0656* (2013.01); *G06F 3/064* (2013.01); *G06F 3/0604* (2013.01); *G06F 3/0652* (2013.01); *G06F 3/0679* (2013.01)

(58) Field of Classification Search
None
See application file for complete search history.

(56) References Cited

FOREIGN PATENT DOCUMENTS

| KR | 10-2017-0065726 A | 6/2017 |
|---|---|---|
| KR | 10-2020-0011831 A | 2/2020 |

*Primary Examiner* — Kevin Verbrugge
(74) *Attorney, Agent, or Firm* — IP & T Group LLP

(57) ABSTRACT

The memory system includes: a first sub-buffer for storing an address map table; a second sub-buffer configured to sequentially store logical addresses, and store a latest received logical address in a specific region; a third sub-buffer including write buffers configured to store a size of data corresponding to each of the logical addresses; a storage device comprising memory blocks; a processor configured to control the storage device to store the data in memory blocks corresponding to the logical addresses using a SLC method; and an address manager configured to select at least two logical addresses comprising the latest received logical address. The processor is configured to control the storage device to store data read from memory blocks corresponding to the at least two logical addresses in a memory block using an MLC method. The address manager is configured to release a write buffer corresponding to the latest received logical address.

20 Claims, 17 Drawing Sheets

MEMORY SYSTEM AND OPERATING METHOD OF THE MEMORY SYSTEM

CROSS-REFERENCE TO RELATED APPLICATION

The present application claims priority under 35 U.S.C. § 119(a) to Korean patent application number 10-2021-0002201 filed on Jan. 7, 2021, the entire disclosure of which is incorporated by reference herein.

BACKGROUND

Field of Invention

The present disclosure generally relates to a memory system and an operating method of the memory system, and more particularly, to a memory system capable of performing a migration operation and an operating method of the memory system.

Description of Related Art

A memory system may include a storage device capable of storing data and a memory controller capable of controlling the storage device.

The memory device may be classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which stored data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a memory system capable of efficiently managing a migration operation and an operating method of the memory system.

In accordance with an aspect of the present disclosure, there is provided a memory system including: a first sub-buffer configured to store an address map table in which logical addresses associated with program requests received from a host and physical addresses used in the memory system are mapped to each other; a second sub-buffer configured to sequentially store the logical addresses received from the host and store a latest received logical address in a specific region; a third sub-buffer including write buffers each configured to store a size of data corresponding to one of the logical addresses; a storage device comprising a plurality of memory blocks, each of the plurality of memory blocks comprising a plurality of memory cells; a processor configured to control the storage device to store the data in memory blocks corresponding to the physical addresses respectively mapped to the logical addresses using a single level cell (SLC) method; and an address manager configured to select at least two logical addresses for a migration operation from among the logical addresses stored in the second sub-buffer, the at least two logical addresses including the latest received logical address stored in the specific region of the second sub-buffer. The processor may be configured to control the storage device to store data read from memory blocks corresponding to the at least two logical addresses in a memory block using a multi level cell (MLC) method. The address manager may be configured to release a write buffer corresponding to the latest received logical address from among the write buffers.

In accordance with another aspect of the present disclosure, there is provided a memory system including: a storage device including a plurality of memory blocks; and a memory controller configured to control the storage device such that data is programmed in the memory blocks, wherein the memory controller includes: a central processing unit configured to generate a first program command of a single level cell (SLC) method or a second program command of a multi-level cell (MLC)-or-more method; a buffer configured to store logical addresses, physical addresses, and a size of data corresponding to each of the logical addresses; and an address manager configured to store, in a specific region included in the buffer, a latest received logical address among logical addresses received from a host when the first program command is generated, select the logical address stored in the specific region when the second program command is generated, and release a write buffer in which the size of the data corresponding to the selected logical address is stored.

In accordance with still another aspect of the present disclosure, there is provided a method for operating a memory system, the method including: writing a first logical address mapped to a first physical address in a specific region included in a buffer according to a first program request of a host; storing a first data size corresponding to the first logical address in a first write buffer included in the buffer; performing a program operation to store the data in first memory blocks allocated to the first physical address by using a single level cell (SLC) method; storing a second logical address mapped to a second physical address in the specific region included in the buffer according to a second program request of the host; storing a second data size corresponding to the second logical address in a second write buffer included in the buffer; performing a program operation to store the data in second memory blocks allocated to the second physical address by using the SLC method; when any request of the host does not exist during a preset time, selecting the second logical address stored in the specific region, and performing a program operation to store the data read from the second memory blocks corresponding to the selected second logical address in the first memory blocks by using a multi level cell (MLC) method; and releasing the second write buffer corresponding to the second logical address.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
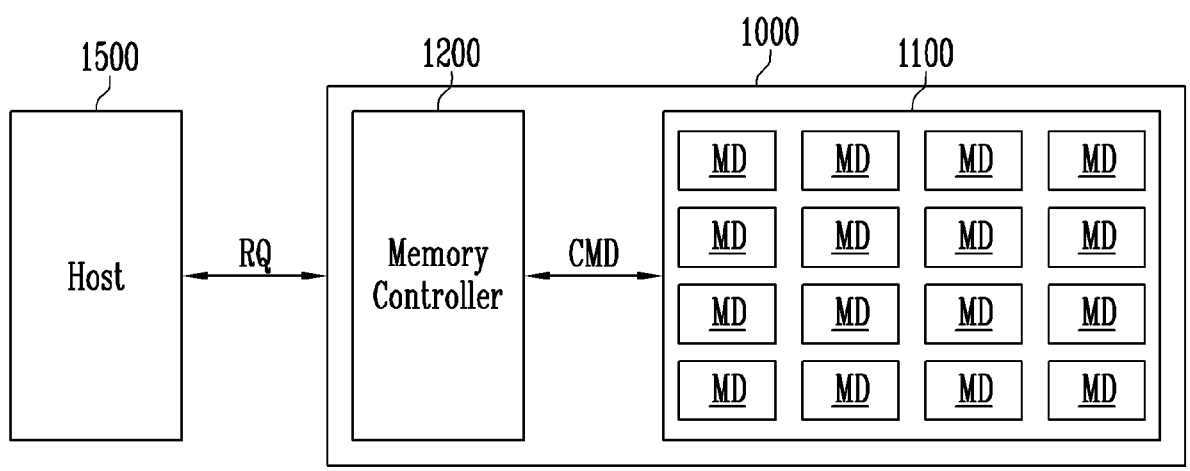
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a storage device 1100 and a memory controller 1200. The storage device 1100 may include a plurality of memory devices MD, and the memory devices MD may be connected to the memory controller 1200 through input/output lines.

The memory controller 1200 may communicate between a host 1500 and the memory devices MD. The memory controller 1200 may generate a command CMD for controlling the memory devices MD according to a request RQ of the host 1500, and perform a background operation for performance improvement of the memory system 1000 even when the request RQ of the host 1500 does not exist. For example, a migration operation may be performed as the background operation. The migration operation means an operation of rapidly programming data output from the host by using a single level cell (SLC) method and then reprogramming the data by using a multi-level cell (MLC)-or-more method when no operation or a small number of operations is performed in the memory controller 1200. That is, through the migration operation, data programmed in a plurality of memory blocks by using the SLC method may be reprogrammed in one memory block by the MLC-or-more method, which makes the storage efficiency of the memory blocks greater. The SLC method means a method in which 1-bit data is stored in one memory cell, and the MLC method means a method in which 2-bit data is stored in one memory cell. A triple level cell (TLC) method, a quadruple level cell (QLC) method, or the like may be applied as the MLC-or-more method. The TLC method means a method in which 3-bit data is stored in one memory cell, and the QLC method means a method in which 4-bit data is stored in one memory cell.

The host 1500 may generate requests RQ for various operations, and output the generated requests RQ to the memory system 1000. For example, the requests RQ may include a program request for requesting a program operation, a read request for requesting a read operation, an erase request for requesting an erase operation, and the like.

The host 1500 may communicate with the memory system 1000 through various communication standards or interfaces such as Peripheral Component Interconnect-Express (PCI-E), Advanced Technology Attachment (ATA), Serial ATA (SATA), Parallel ATA (PATA), Serial Attached SCSI (SAS), Non-Volatile Memory Express (NVMe), a Universal Serial Bus (USB), a Multi-Media Card (MMC), an Enhanced Small Disk Interface (ESDI), and Integrated Drive Electronics (IDE).

Figure 2:
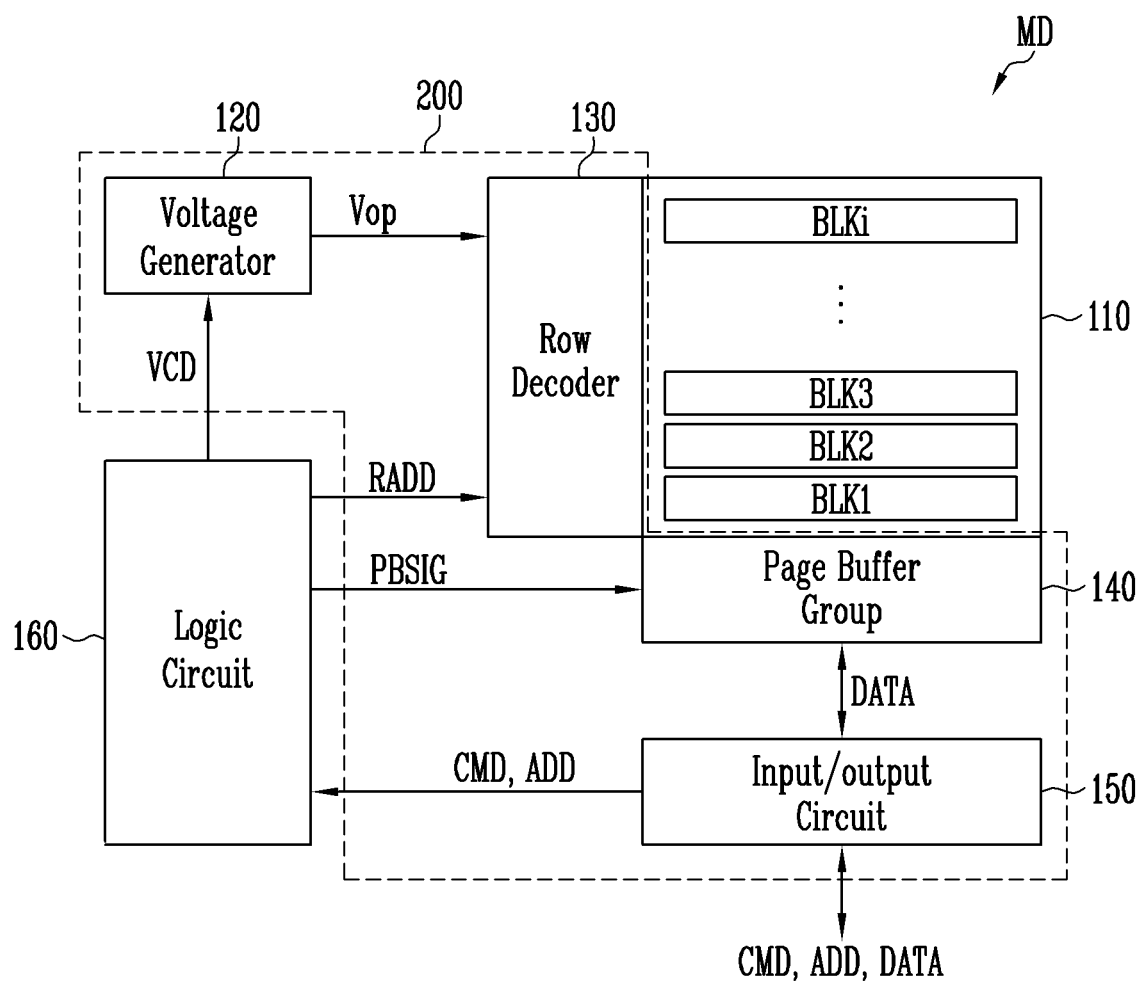
FIG. 2 is a diagram illustrating a memory device in accordance with an embodiment of the present disclosure.

FIG. 2 is a diagram illustrating a memory device in accordance with an embodiment of the present disclosure.

Referring to FIG. 2, the memory device MD may include a memory cell array 110 in which data is stored, a peripheral circuit 200 for performing a program, read or erase operation, and a logic circuit 160 for controlling the peripheral circuit 200.

The memory cell array 110 may include a plurality of memory blocks BLK1 to BLKi in which data is stored. The memory blocks BLK1 to BLKi may be configured to have the physically same structure. Each of the memory blocks BLK1 to BLKi may include a plurality of memory cells, and the memory cells may be implemented in a two-dimensional structure in which the memory cell are arranged in parallel direction to a substrate or a three-dimensional structure in which the memory cells are stacked in a vertical direction over a substrate.

The peripheral circuit 200 may include a voltage generator 120, a row decoder 130, a page buffer group 140, and an input/output circuit 150.

The voltage generator 120 may generate and output operating voltages Vop necessary for various operations in response to a voltage code VCD. For example, the voltage generator 120 may generate and output a program voltage, a verify voltage, a read voltage, a pass voltage, an erase voltage, and the like, which have various levels.

The row decoder 130 may select one memory block among the memory blocks BLK1 to BLKi included in the memory cell array 110 according to a row address RADD, and transmit the operating voltages Vop to the selected memory block.

The page buffer group 140 may be connected to the memory cell array 110 through bit lines. For example, the page buffer group 140 may include page buffers connected to the respective bit lines. The page buffers may simultaneously operate in response to page buffer control signals PBSIG, and temporarily store data in a program or read operation. For example, in the program operation, the page buffer group 140 may adjust a voltage of the bit lines according to data received through the input/output circuit 150. In the read operation, the page buffer group 140 may temporarily store data sensed from selected memory cells, and transmit the temporarily stored data to the input/output circuit 150.

The input/output circuit 150 may be connected to the memory controller (1200 shown in FIG. 1) through input/output lines. The input/output circuit 150 may input/output a command CMD, an address ADD, and data DATA through the input/output lines. For example, the input/output circuit 150 may transmit, to the logic circuit 160, the command CMD and the address ADD, which are received through the input/output lines, and transmit the data received through the input/output lines to the page buffer group 140. The input/output circuit 150 may output data DATA received from the page buffer group 140 to the memory controller 1200 through the input/output lines.

The logic circuit 160 may output the voltage code VCD, the row address RADD, and the page buffer control signals PBSIG in response to the command CMD and the address ADD. For example, the logic circuit 160 may include software for performing an algorithm in response to the command CMD and hardware configured to output various signals according to the address ADD and the algorithm.

Figure 3:
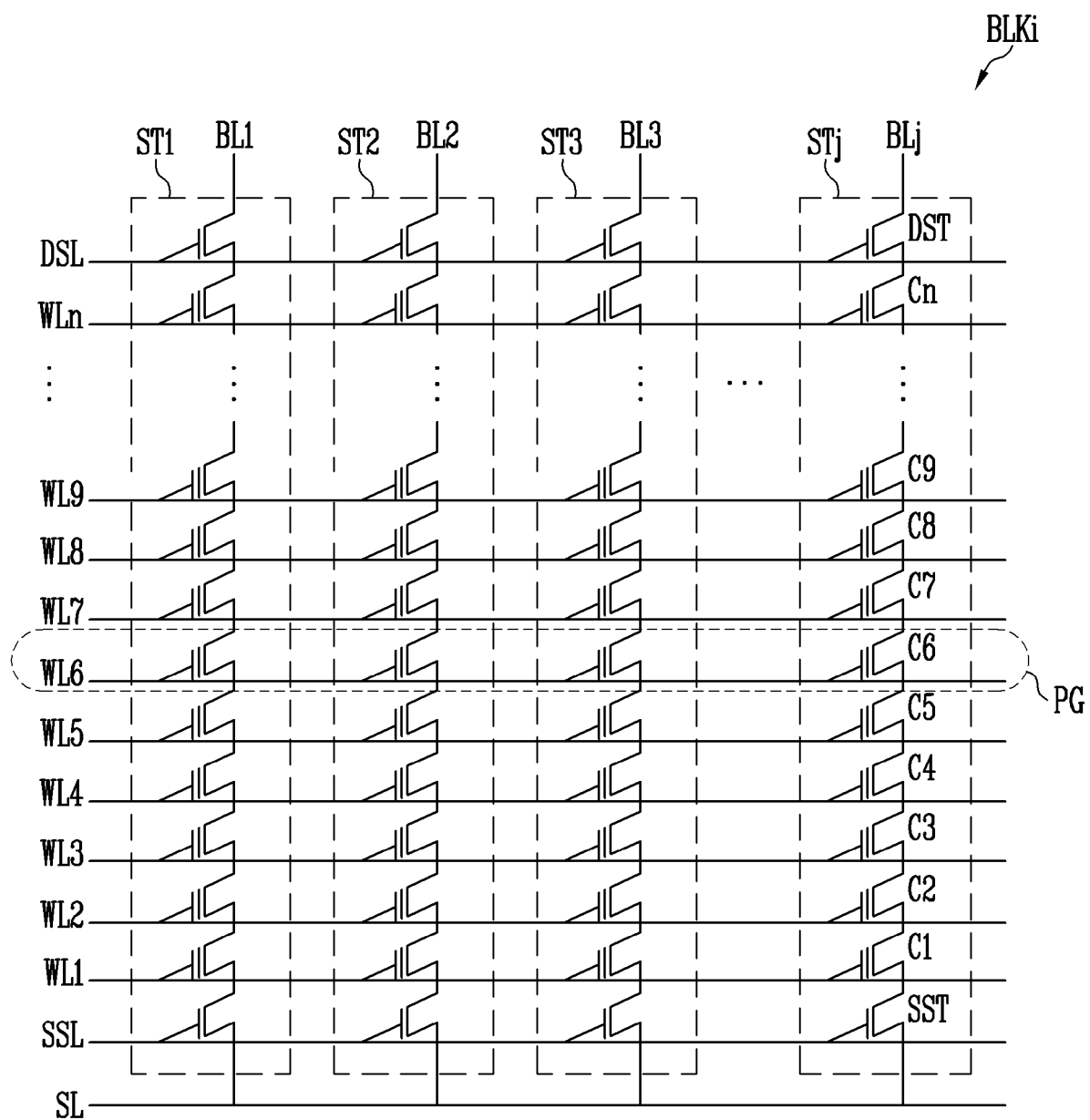
FIG. 3 is a diagram illustrating a memory block.

FIG. 3 is a diagram illustrating a memory block, and an ith memory block BLKi among the plurality of memory blocks BLK1 to BLKi shown in FIG. 2 is illustrated as an example.

Referring to FIG. 3, the ith memory block BLKi may include a plurality of strings ST1 to STj (j is a positive integer). First to jth strings ST1 to STj may be connected between bit lines BL1 to BLj and a source line SL. For example, the first string ST1 may be connected between a first bit line BL1 and the source line SL, the second string ST2 may be connected between a second bit line BL2 and the source line SL, and the jth string STj may be connected between a jth bit line BLj and the source line SL.

Each of the first to jth strings ST1 to STj may include a source select transistor SST, a plurality of memory cells C1 to Cn, and a drain select transistor DST. Although not shown in the drawing, dummy cells may be further included between the memory cells C1 to Cn and the source or drain select transistor SST or DST. A configuration of the string will be described in detail as follows by using the jth string STj as an example.

A source select transistor SST included in the jth string STj may electrically connect the source line SL and a first memory cell C1 to each other or block connection between the source line SL and the first memory cell C1 according to a voltage applied to a source select line SSL. Gates of first to nth memory cells C1 to Cn may be respectively connected to first to nth word lines WL1 to WLn. A drain select transistor DST included in the jth string STj may electrically connect the jth bit line BLj and an nth memory cell Cn to each other or block connection between the jth bit line BLj and the nth memory cell Cn according to a voltage applied to a drain select line DSL. Gates of source select transistors SST included in different strings ST1 to STj may be commonly connected to the source select line SSL, gates of first to nth memory cells C1 to Cn included in different strings ST1 to STj may be connected to the first to nth word lines WL1 to WLn, and gates of drain select transistors DST included in different strings ST1 to STj may be commonly connected to the drain select line DSL. A group of memory cells connected to the same word line is referred to as a page PG, and program and read operations may be performed in units of pages PG.

One logical page data may be programmed to a selected page PG in the SLC method, and two logical page data may be programmed to the selected page PG in the MLC method. Three logical page data may be programmed to the selected page PG in the TLC method, and four logical page data may be programmed to the selected page PG in the QLC method. That is, the number of bits programmed to the selected page are different from one another according to the SLC, MLC, TLC, and QLC methods, and a number of logical page data may be determined according to the number of bits.

Figure 4:
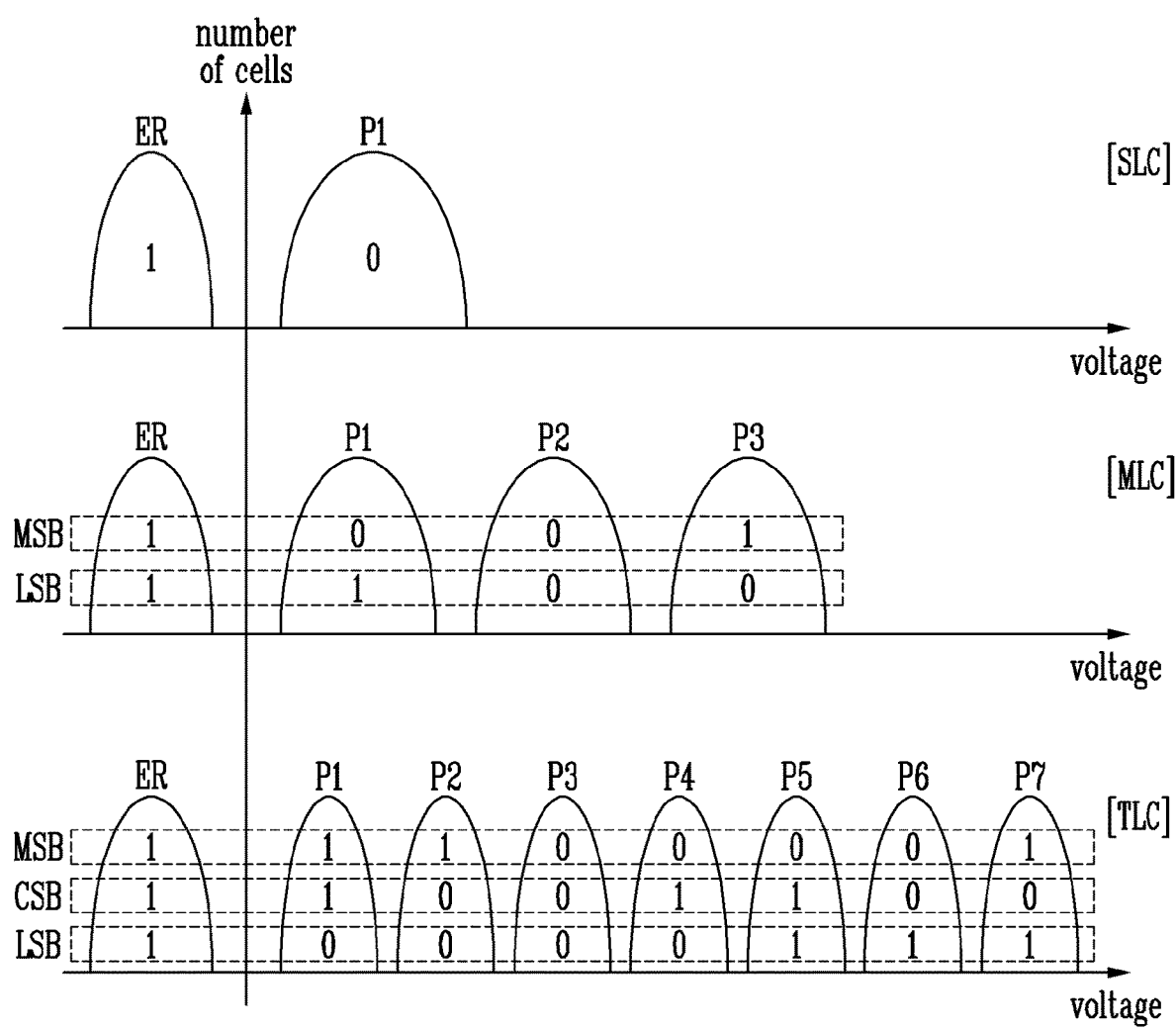
FIG. 4 is a diagram illustrating threshold voltage distributions of memory cells according to various program methods.

FIG. 4 is a diagram illustrating threshold voltage distributions of memory cells according to various program methods.

Referring to FIG. 4, 1-bit data may be stored in one memory cell in the SLC method, 2-bit data may be stored in one memory cell in the MLC method, and 3-bit data may be stored in one memory cell in the TLC method.

In the SLC method, a memory cell in which data 1 is stored may be in an erase state ER, and a memory cell in which data 0 is stored may be in a first program state P1. The first program state P1 is a state having a threshold voltage higher than that of the erase state ER.

In the MLC method, memory cells may be in any state among an erase state ER and first to third program states P1 to P3 according to 2-bit logical page data. For example, in the MLC method, logical page data may include least significant bit (LSB) data and most significant bit (MSB) data. A memory cell in which the LSB and MSB data correspond to 11 may be in the erase state ER, a memory cell in which the LSB and MSB data correspond to 10 may be in the first program state P1, a memory cell in which the LSB and MSB data correspond to 00 may be in the second program state P2, and a memory cell in which the LSB and MSB data correspond to 01 may be in the third program state P3. A threshold voltage of the first program state P1 is higher than that of the erase state ER, a threshold voltage of the second program state P2 is higher than that of the first program state P1, and a threshold voltage of the third program state P3 is higher than that of the second program state P2.

In the TLC method, memory cells may be in any state among an erase state ER and first to seventh program states P1 to P7 according to 3-bit logical page data. For example, in the TLC method, logical page data may include least significant bit (LSB) data, a central significant bit (CSB) data, and most significant bit (MSB) data.

The combination of logical page data in each of the MLC and TLC methods is not limited to the embodiment shown in FIG. 4, and may be changed to various combinations.

Figure 5:
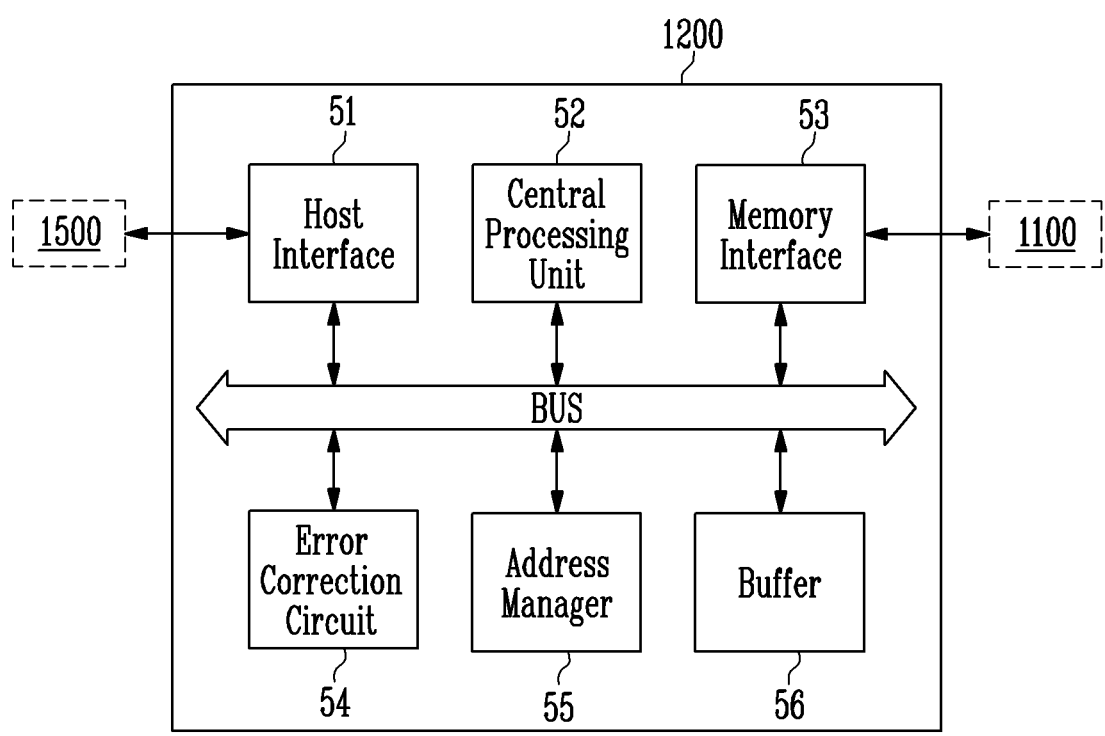
FIG. 5 is a diagram illustrating a memory controller in accordance with an embodiment of the present disclosure.

FIG. 5 is a diagram illustrating a memory controller in accordance with an embodiment of the present disclosure.

Referring to FIG. 5, the memory controller 1200 may include a host interface 51, a central processing unit (or a processor) 52, a memory interface 53, an error correction circuit 54, an address manager 55, and a buffer 56. The host interface 51, the central processing unit 52, the memory interface 53, the error correction circuit 54, the address manager 55, and the buffer 56 may communicate with each other through a bus.

The host interface may exchange a request, an address, data, and the like between the memory controller 1200 and the host 1500. For example, the host interface 51 may include various interfaces such as Peripheral Component Interconnect express (PCIe), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

The central processing unit 52 may control the storage device 1100. Specifically, the central processing unit 52 may generate various commands for controlling the storage device 1100 according to a request of the host 1500, and control the units 51 and 53 to 56 included in the memory controller 1200. The central processing unit 52 may control the storage device 1100 to store the data in memory blocks corresponding to the physical addresses respectively mapped to the logical addresses using a first method. For example, when a program request is received from the host 1500, the central processing unit 52 may generate a program command of the first method, and control the units 51 and 53 to 56 included in the memory controller 1200 such that a program operation is performed. When any request output from the host 1500 does not exist or when a number of operations being processed in the memory controller 1200 is less than a reference number, the central processing unit 52 may generate commands of a second method to perform a migration operation, and control the units 51 and 53 to 56 included in the memory controller 1200 such that the migration operation is performed. In other words, the central processing unit 52 may control the storage device 1100 to store data read from memory blocks corresponding to the at least two logical addresses in a memory block using the second method. For example, the first method may be the SLC method, and the second method may be the MLC-or-more method. For example, the second method may be the MLC, TLC or QLC method. In order to perform the migration operation, the central processing unit 52 may output a read command, a program command, or an erase command according to a set time.

The memory interface 53 may output a command, an address, or data to the storage device 1100, or receive data output from the storage device 1100.

The error correction circuit 54 may detect and correct an error of data in a program or read operation. For example, the error correction circuit 54 may encode data received from the host 1500 in the program operation, and decode data received from the storage device 1100 in the read operation. A Low Density Parity Check (LDPC) code may be used in encoding and decoding, and an error correction operation using various types of codes in addition to the LDPC code may be performed. Although a case where the error correction circuit 54 is included in the memory controller 1200 is illustrated in FIG. 5, the error correction circuit 54 may be disposed at the outside of the memory controller 1200 according to the memory system.

The address manager 55 may manage logical addresses used in the host 1500 and physical addresses used in the storage device 1100. The address manager 55 may receive the logical addresses and data for the program operation from the host 1500. For example, in the program operation, the address manager 55 may generate an address map table by mapping logical and physical addresses to each other, and store the address map table in the buffer 56. In the read operation, the address manager 55 may search for a physical address mapped to a logical address in the buffer 56. Also, in the migration operation, the address manager 55 may search for a logical address corresponding to a latest performed program operation in the buffer 56, and release a write buffer corresponding to the logical address to be in an available state.

The buffer 56 may store various system data used in the memory controller 1200. For example, the buffer 56 may be configured as a dynamic random access memory (DRAM) or a static random access memory (SRAM), but include a nonvolatile memory.

Figure 6:
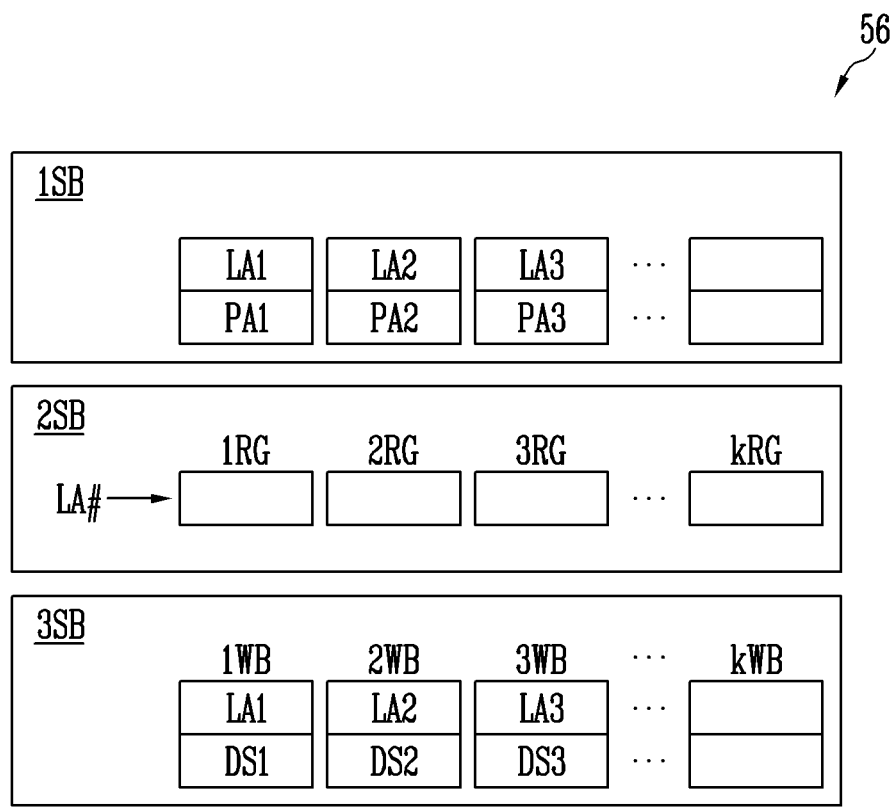
FIG. 6 is a diagram illustrating a buffer shown in FIG. 5, in accordance with an embodiment of the present disclosure.

FIG. 6 is a diagram illustrating the buffer shown in FIG. 5, in accordance with an embodiment of the present disclosure.

Referring to FIG. 6, the buffer 56 may include a first sub-buffer 1SB for storing an address map table, a second sub-buffer 2SB for storing logical addresses used in a program operation, and a third sub-buffer 3SB for storing a size of data corresponding to a logical address. For example, logical addresses and information of a size of data corresponding to each of the logical addresses may be stored in the third sub-buffer 3SB.

The first sub-buffer 1SB may store the address map table generated by the address manager (55 shown in FIG. 5). The address map table may include information of physical addresses mapped to logical addresses. For example, a first logical address LA1 may be mapped to a first physical address PA1, a second logical address LA2 may be mapped to a second physical address PA2, and a third logical address LA3 may be mapped to a third physical address PA3. The first to third physical addresses PA1 to PA3 may respectively correspond to different pages of different memory blocks, or respectively correspond to different pages of the same memory block.

The second sub-buffer 2SB may include first to kth regions 1RG to kRG configured to sequentially store logical addresses LA # selected in a program operation. For example, a logical address first selected in the program operation may be stored in the first region 1RG. Subsequently, when a next selected logical address is input, the logical address stored in the first region 1RG may be transmitted to the second region 2RG, and the next selected logical address may be stored in the first region 1RG. That is, a latest used logical address in the program operation may be stored in the first region 1RG.

The third sub-buffer 3SB may include first to kth write buffers 1WB to kWB configured to store information of a size of data corresponding to each of logical addresses used in the program operation. For example, when the first logical address LA1 and a first data size DS1 are stored in the first write buffer 1WB, this means that the size of data stored in a memory block corresponding to the first logical address LA1 is the first data size DS1. When the second logical address LA2 is selected next to the first logical address LA1, and the size of data stored in a memory block corresponding to the second logical address LA2 is a second data size DS2, the second logical address LA2 and the second data size DS2 may be stored in the second write buffer 2WB.

Before a migration operation is performed, data may be stored in memory blocks corresponding to the first and second logical addresses LA1 and LA2, respectively. After the migration operation is performed, the data may be migrated into a memory block commonly corresponding to the first and second logical addresses LA1 and LA2. In this situation, one of the first write buffer 1WB in which the first data size DS1 corresponding to the first logical address LA1 is stored and the second write buffer 2WB in which the second data size DS2 corresponding to the second logical address LA2 is stored becomes unnecessary. In this embodiment, there is proposed a method for releasing a write buffer which becomes unnecessary due to the migration operation to be used in another operation.

Figure 7:
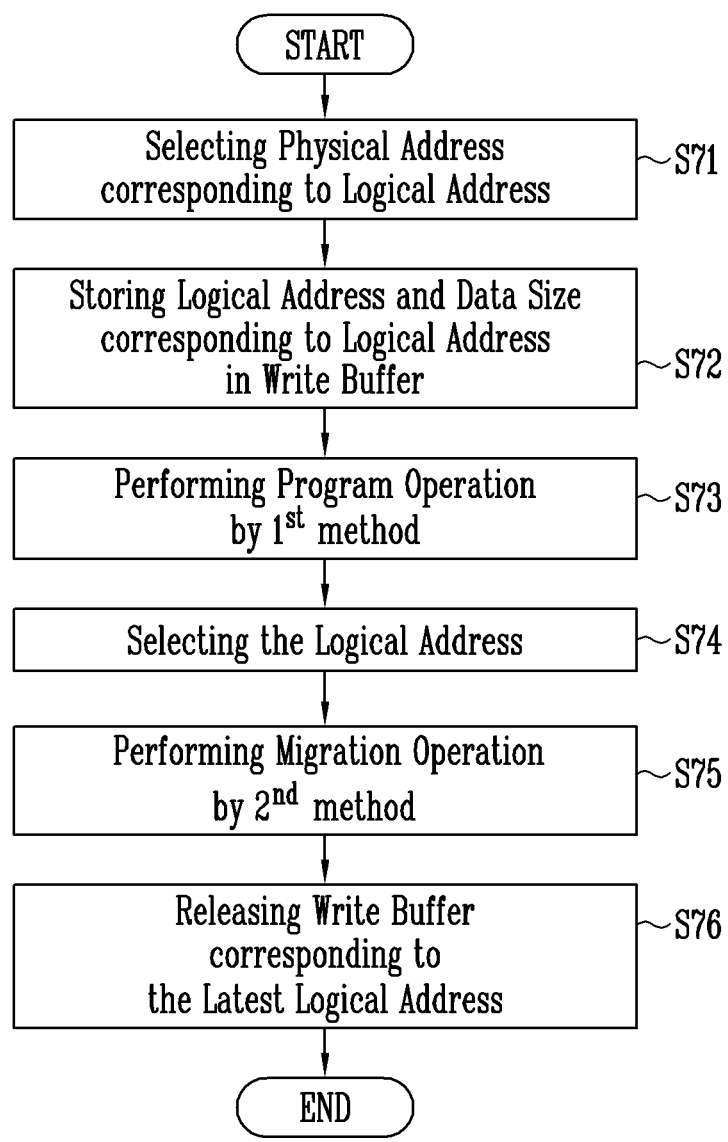
FIG. 7 is a diagram illustrating program and migration operations in accordance with an embodiment of the present disclosure.

FIG. 7 is a diagram illustrating program and migration operations in accordance with an embodiment of the present disclosure.

Referring to FIG. 7, when the host transmits data together with a program request to the memory system, the memory controller (1200 shown in FIG. 5) included in the memory system may select a physical address corresponding to a logical address according to a size of data output from the host (S71). For example, the address manager (55 shown in FIG. 5) included in the memory controller 1200 may select a physical address of a memory block or memory blocks, in which data to be programmed can be stored, corresponding to a logical address.

The address manager 55 may record the logical address in the second sub-buffer (2SB shown in FIG. 6), and record the logical address and a size of data corresponding thereto in the third sub-buffer (3SB shown in FIG. 6) (S72).

When the memory controller 1200 transmits a physical address corresponding to the logical address, a command, and data to the storage device, a program operation may be performed in a selected memory device of the storage device (S73). In operation S73, the program operation may be performed by using a first method to rapidly perform the program operation requested by the host. The first method may be a method in which a program operation time is relatively short among various program methods. For example, the first method may be the SLC method.

When the program operation requested by the host is completed, the memory controller 1200 may perform a preparation operation for performing a migration operation, the preparation operation being an operation of selecting a memory block, into which data programmed in a plurality of memory blocks by using the first method are to be migrated. When the preparation operation for the migration operation is started, the address manager 55 may select a logical address stored in the second sub-buffer 2SB (S74).

The migration operation may be performed to migrate data from a memory block corresponding to the logical address selected in operation S74 into a memory block in which another data is already stored in a previous program operation (S75). In the migration operation, a program operation of a second method may be performed such that the data from the memory block corresponding to the logical address selected in operation S74 is stored in memory cells or memory blocks, having a number which is less than that in the first method. For example, the second method may be the MLC, TLC or QLC method.

When the migration operation is completed, the address manager 55 may release a write buffer corresponding to a latest selected logical address in the second sub-buffer 2SB among write buffers included in the third sub-buffer 3SB (S76). The released write buffer is in a state available for another operation.

The operations S71 to S73 among the above-described operations will be described in detail as follows.

Figure 8:
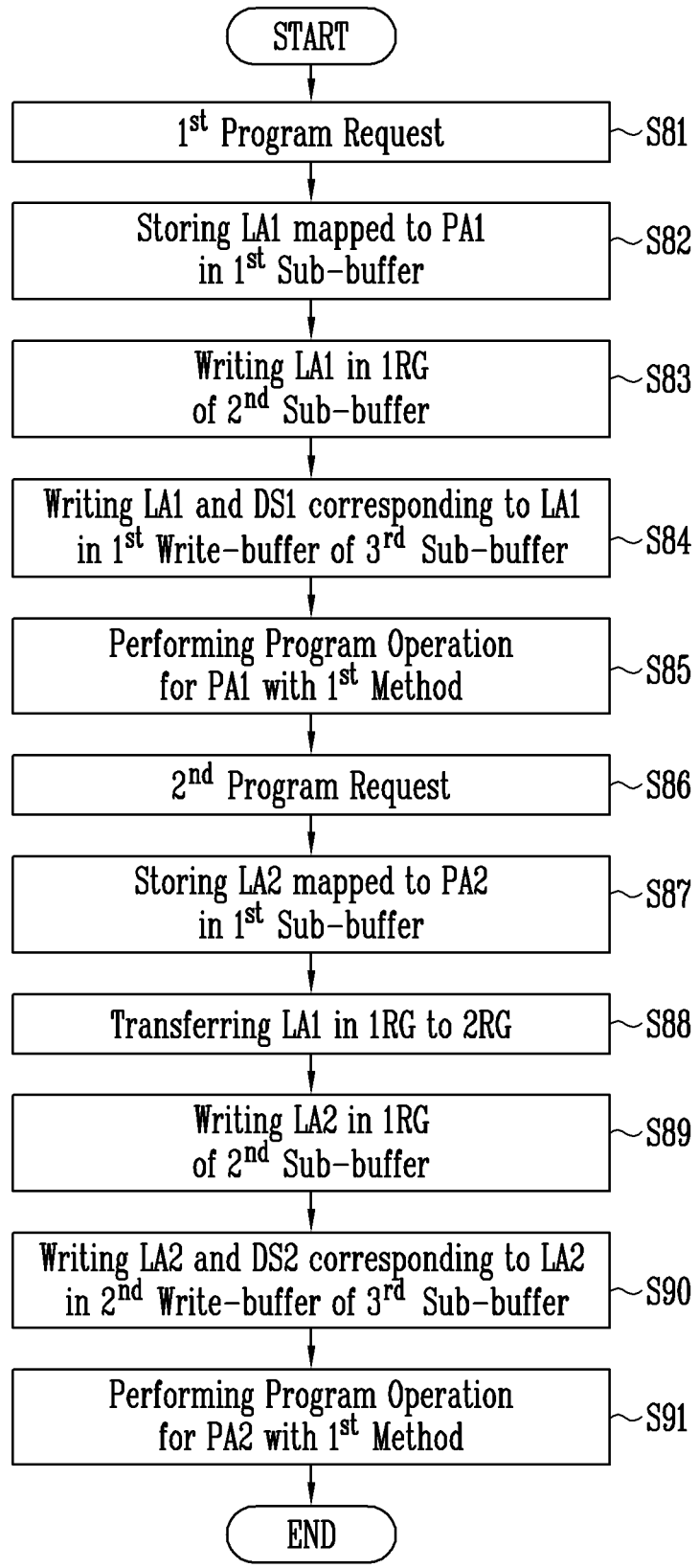
FIG. 8 is a diagram illustrating in detail a program operation performed in a program mode shown in FIG. 7, in accordance with an embodiment of the present disclosure.

FIG. 8 is a diagram illustrating in detail a program operation performed in a program mode shown in FIG. 7, in accordance with an embodiment of the present disclosure.

Referring to FIG. 8, when the host transmits a first program request together with data to the memory system (S81), the memory controller (1200 shown in FIG. 5) included in the memory system may select a first physical address PA1 according to a size of data to be programmed in response to the first program request, and store a first logical address LA1 mapped to the first physical address PA1 in the first sub-buffer (1SB shown in FIG. 6) (S82). That is, an address map table in which the first physical address PA1 and the first logical address LA1 are mapped to each other may be stored in the first sub-buffer 1SB.

The address manager (55 shown in FIG. 5) included in the memory controller 1200 may write the first logical address LA1 in the first region 1RG of the second sub-buffer (2SB shown in FIG. 6) (S83), and write a first data size DS1 i.e., a size of data corresponding to the first logical address LA1 and the first logical address LA1 in the first write buffer 1WB of the third sub-buffer (3SB shown in FIG. 6) (S84).

The memory controller 1200 may generate a program command of the first method, and transmit the program command of the first method, the first physical address PA1, and the data to the storage device (1100 shown in FIG. 1). The storage device (1100 shown in FIG. 1) may perform a program operation on memory blocks or pages, which correspond to the first physical address PA1, by using the first method in response to the first program command of the first method (S85).

Subsequently, when the host transmits a second program request together with data to the memory system (S86), the memory controller 1200 included in the memory system may select a second physical address PA2 according to a size of data to be programmed in response to the second program request, and store a second logical address LA2 mapped to the second physical address PA2 in the first sub-buffer 1SB (S87). That is, an address map table in which the second physical address PA2 and the second logical address LA2 are mapped to each other may be stored in the first sub-buffer 1SB.

The address manager 55 included in the memory controller 1200 may move the first logical address LA1 previously written in the first region 1RG of the second sub-buffer 2SB to the second region 2RG (S88). Subsequently, the address manager 55 may write the second logical address LA2 in the first region 1RG (S89).

The address manager 55 may write a second data size DS2 i.e., a size of data corresponding to the second logical address LA2 and the second logical address LA2 in the second write buffer 2WB of the third sub-buffer 3SB (S90).

The memory controller 1200 may generate a program command of the first method, and transmit the program command of the first method, the second physical address PA2, and the data to the storage device 1100. The storage device 1100 may perform a program operation on memory blocks or pages, which correspond to the second physical address PA2, by using the first method in response to the first program command of the first method (S91).

When any program request of the host does not exist after the second program request, the memory controller 1200 may perform operation S74.

A method for managing a logical address and a buffer according to the above-described operation will be described in more detail as follows.

Figure 9A:
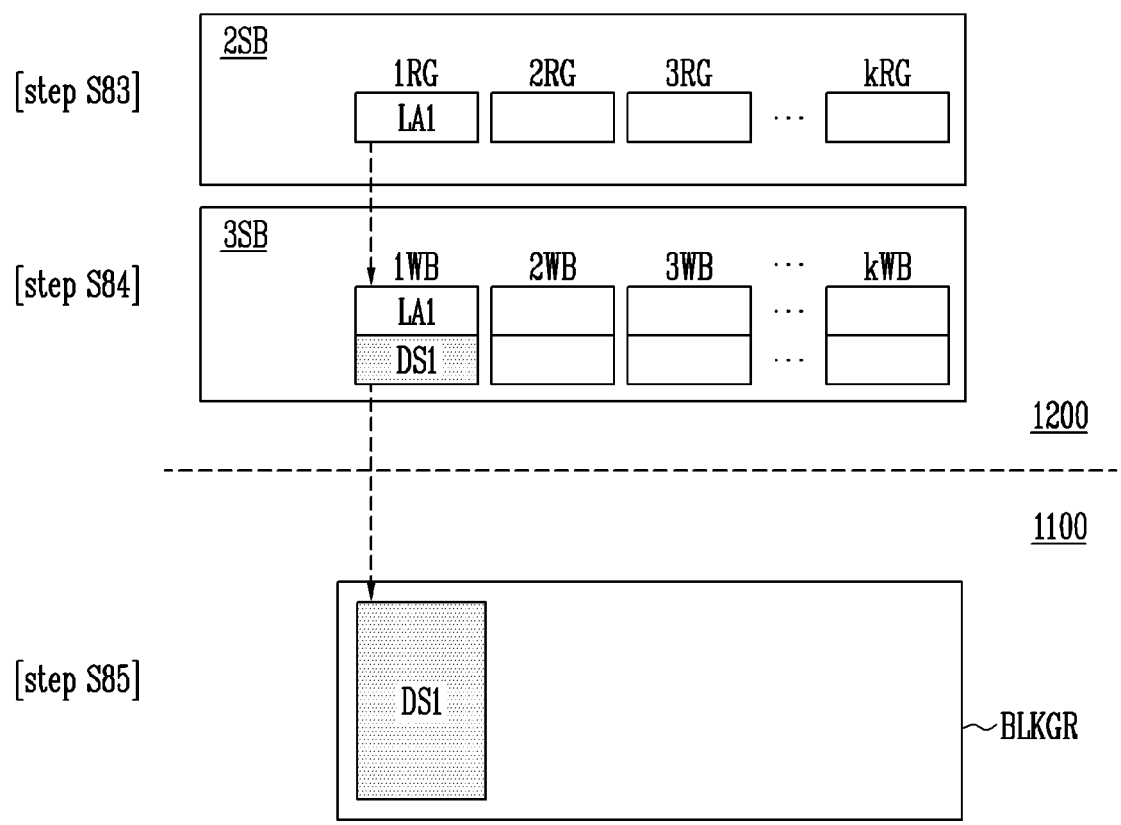
FIGS. 9A and 9B are diagrams illustrating an embodiment of the present disclosure in which a logical address and a buffer are used in a program operation.
Figure 9B:
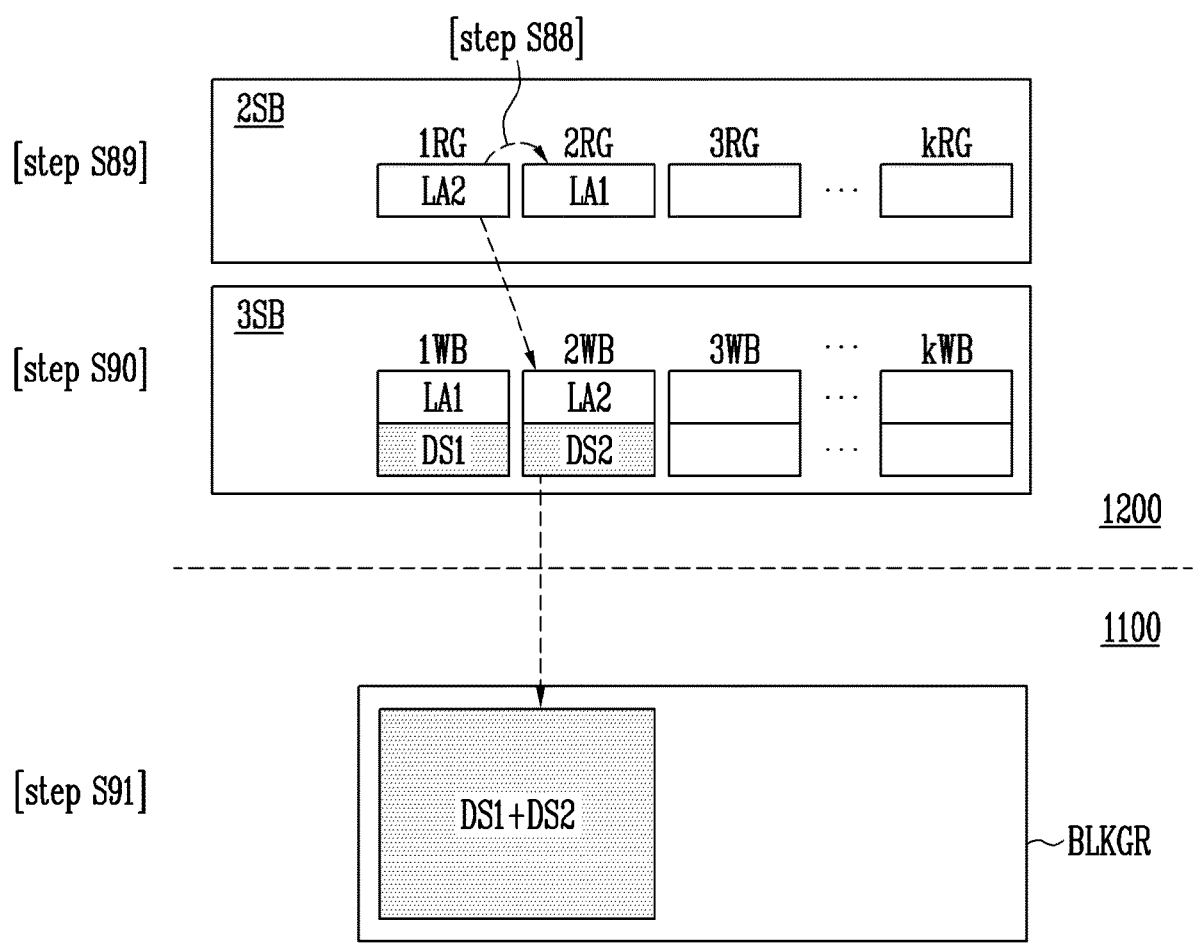

FIGS. 9A and 9B are diagrams illustrating an embodiment of the present disclosure in which a logical address and a buffer are used in a program operation.

Referring to FIGS. 8 and 9A, the second sub-buffer 2SB may include the first to kth regions 1RG to kRG, and logical addresses may be input to the regions from the first region 1RG. In particular, a logical address input to the second sub-buffer 2SB may be input to the first region 1RG, and a logical address previously stored in the first region 1RG may be transmitted to a next region whenever a new logical address is input. Therefore, a latest input logical address may be written in the first region 1RG. For example, when the first logical address LA1 is input to the second sub-buffer 2SB in operation S83, the first logical address LA1 may be written in the first region 1RG.

When the first logical address LA1 is written in the first region 1RG of the second sub-buffer 2SB, the first data size DS1 which is information on a size of data stored in physical blocks corresponding to the first logical address LA1 may be stored in the first write buffer 1WB of the third sub-buffer 3SB (operation S84). For example, the first logical address LA1 and the first data size DS1 corresponding to the first logical address LA1 may be written in the first write buffer 1WB.

When the memory controller 1200 outputs the program command of the first method, the first physical address, and the data to the storage device 1100, the storage device 1100 may perform the program operation on memory blocks or pages, which correspond to the first physical address (operation S85). For example, the storage device 1100 may include a block group BLKGR including a plurality of memory blocks, and one or more memory blocks or one or more pages, which are included in the block group BLKGR, may correspond to the first physical address. In operation S85, data having the first data size DS1 may be programmed to the memory blocks or the pages, which correspond to the first physical address, by using the first method. For example, the first method may be the SLC method, and therefore, 1-bit data may be stored in one memory cell.

Referring to FIGS. 8 and 9B, when the second logical address LA2 is input to the second sub-buffer 2SB, the first logical address LA1 previously written in the first region 1RG of the second sub-buffer 2SB may be transmitted to the second region 2GR (operation S88), and the newly input second logical address LA2 may be written in the first region 1RG (operation S89). That is, a logical address newly input to the second sub-buffer 2SB is always written in the first region 1RG, and a logical address previously written into the first region 1RG is moved to an adjacent region.

When the second logical address LA2 is written in the first region 1RG of the second sub-buffer 2SB, the second data size DS2 which is information on a size of data stored in physical blocks corresponding to the second logical address LA2 may be stored in the second write buffer 2WB of the third sub-buffer 3SB (the step S90). For example, the second logical address LA2 and the second data size DS2 corresponding to the second logical address LA2 may be written in the second write buffer 2WB.

When the memory controller 1200 outputs the program command of the first method, the second physical address, and the data to the storage device 1100, the storage device 1100 may perform the program operation on memory blocks or pages, which correspond to the second physical address (operation S91). For example, the storage device 1100 may include a block group BLKGR including a plurality of memory blocks, and one or more memory blocks or one or more pages, which are included in the block group BLKGR, may correspond to the second physical address. In operation S91, data having the second data size DS2 may be programmed in the memory blocks or the pages, which correspond to the second physical address, by using the first method. The second data size DS2 may be equal to the first data size DS1.

In accordance with the embodiment described with reference to the drawings shown in FIGS. 9A and 9B, since the first method is performed as the SLC method, a program operation speed is fast as compared with various program methods, but a number of memory blocks used may increase. Therefore, when any additional program request of the host does not exist, the memory controller 1200 may perform a migration operation for decreasing the number of memory blocks in which data is stored.

A buffer management method for performing the migration operation will be described in detail with reference to the following drawings.

Figure 10A:
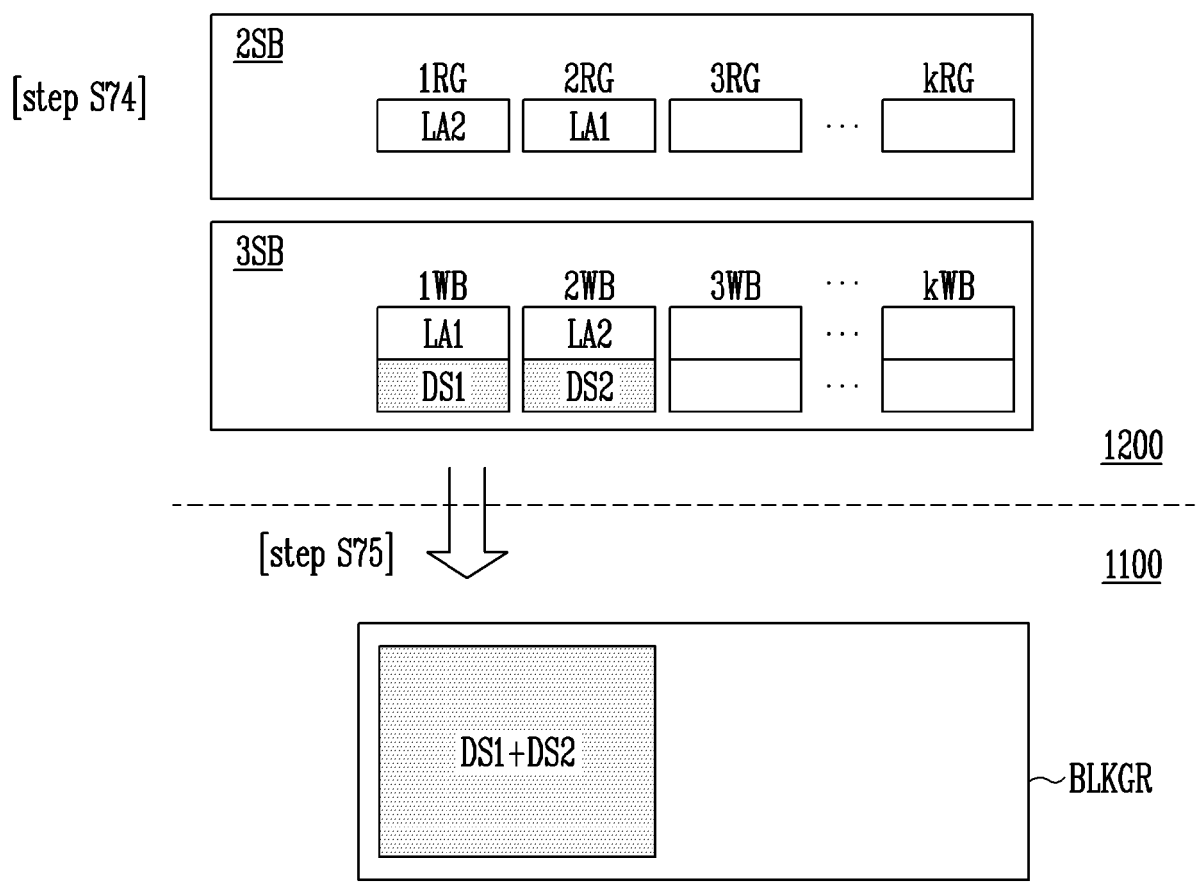
FIGS. 10A to 10C are diagrams illustrating an embodiment of the present disclosure in which a logical address and a buffer are used in a migration operation.
Figure 10B:
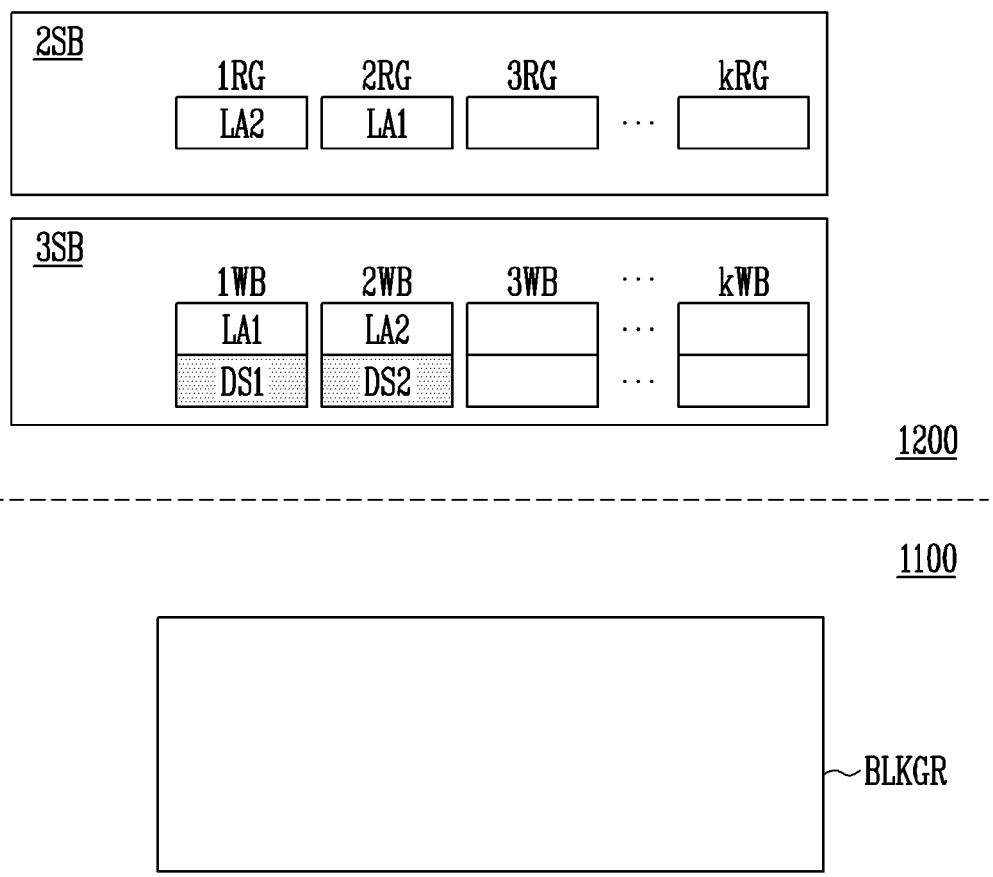
Figure 10C:
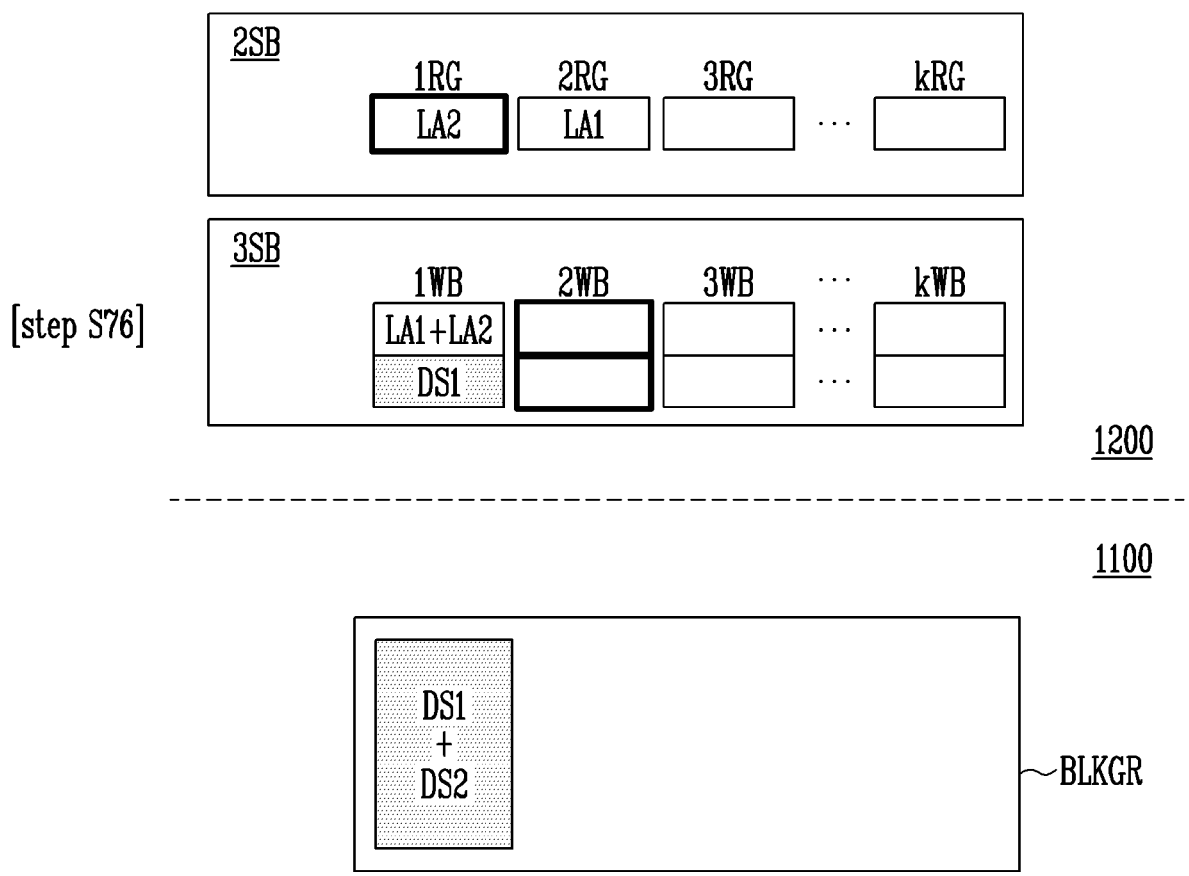

FIGS. 10A to 10C are diagrams illustrating an embodiment of the present disclosure in which a logical address and a buffer are used in a migration operation.

Referring to FIGS. 7 and 10A, the memory controller 1200 may select a logical address for performing the migration operation. For example, the first and second regions 1RG and 2RG in which the logical address is written in the second sub-buffer 2SB may be selected (operation S74). The memory controller 1200 may output, to the storage device 1100, commands for reading data stored in memory blocks or pages, which correspond to the first and second physical addresses, according to the first and second logical addresses LA1 and LA2 written in the first and second regions 1RG and 2RG (operation S75). For example, the memory controller 1200 may output a read command and the first and second physical addresses to the storage device 1100, and the storage device 1100 may perform a read operation of the memory blocks or the pages, which correspond to the first and second physical addresses. The storage device 1100 may output read data to the memory controller 1200.

Referring to FIG. 10B, the memory controller 1200 may output an erase command and the first and second physical addresses. The storage device 1100 may select memory blocks according to the first and second physical addresses, and perform an erase operation of selected memory blocks in response to the erase command.

Referring to FIGS. 7 and 10C, the memory controller 1200 may output the program command of the second method, the third physical address, and the read data. The storage device 1100 may select memory blocks or pages, which correspond to the third physical address, and program the read data received from the memory controller 1200 to the selected memory blocks or the selected pages in response to the program command of the second method. For example, when the second method is the MLC method, the memory blocks or the pages, which correspond to the third physical address, have a size physically smaller than that of the memory blocks or the pages, which correspond to the first and second physical address, but may store all data corresponding to the first and second data sizes (DS1+DS2).

After the migration operation is performed as described, the memory controller 1200 may check a logical address stored in the first region 1RG corresponding to a specific region in the second sub-buffer 2SB, and release, as a free buffer, the second write buffer 2WB corresponding to the second logical address LA2 stored in the first region 1RG (operation S76). The second logical address LA2 may be stored together with the first logical address LA1 in the first write buffer 1WB.

Figure 11A:
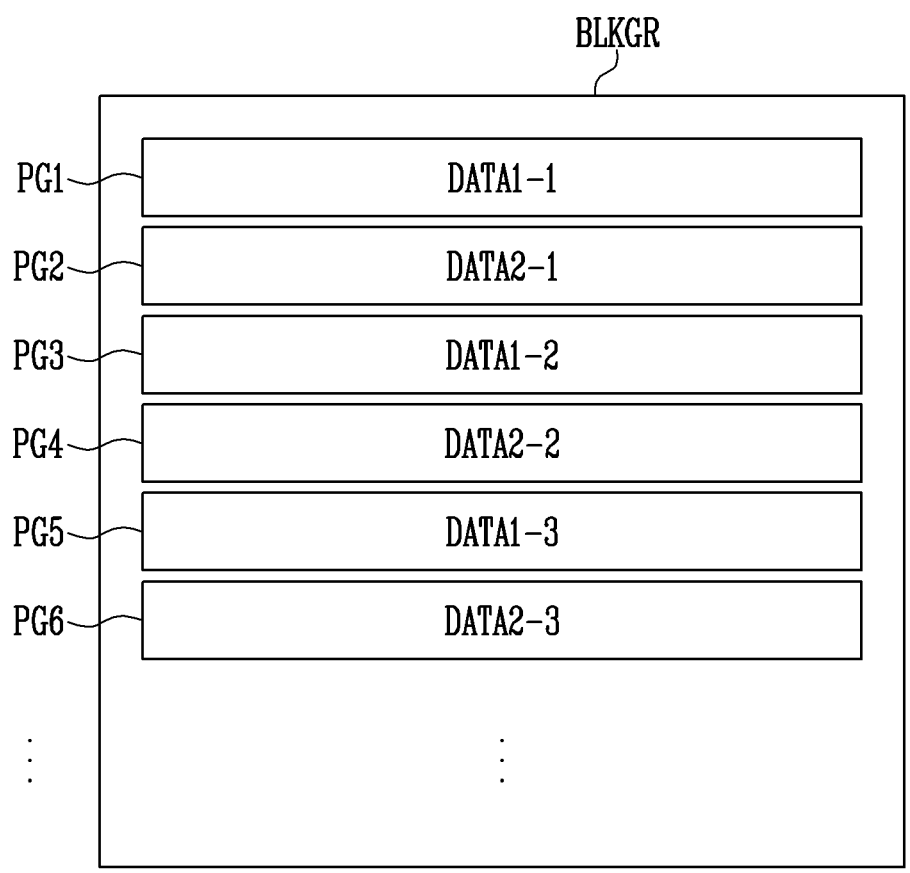
FIGS. 11A and 11B are diagrams illustrating a migration operation.
Figure 11B:
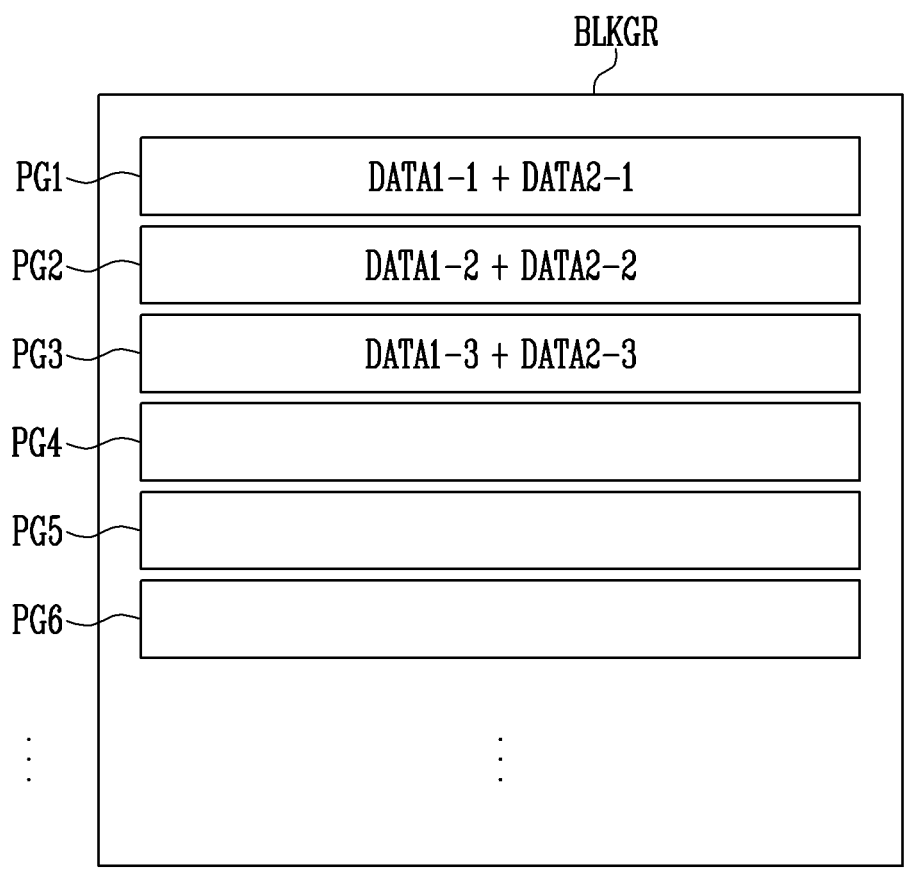

FIGS. 11A and 11B are diagrams illustrating a migration operation.

Referring to FIG. 11A, a plurality of pages may be included in the block group BLKGR. For example, the first, third, and fifth pages PG1, PG3, and PG5 correspond to the first physical address PA1, and second, fourth, and sixth pages PG2, PG4, and PG6 correspond to the second physical address PA2. Pages corresponding to different physical addresses include different memory cells. By the program operation of the first method, which is performed according to the request of the host, (1-1)th to (1-3)th data DATA1-1 to DATA1-3 may be stored in the first, third, and fifth pages PG1, PG3, and PG5 corresponding to the first physical address PA1, and (2-1)th to (2-3)th data DATA2-1 to DATA2-3 may be stored in the second, fourth, and sixth pages PG2, PG4, and PG6 corresponding to the second physical address PA1.

When the first method is the SLC method, 1-bit data may be stored in each of memory cells included in each of the first to sixth pages PG1 to PG6.

Referring to FIG. 11B, when the program operation according to the request of the host is completed, and any additional request of the host does not exist, the memory controller may perform a migration operation for decreasing the number of memory blocks or pages, in which data is stored, and increasing the number of free block s or free pages.

When the migration operation is performed, the (1-1)th and (2-1)th data (DATA1-1+DATA2-1) may be stored in the first page PG1, and the (1-2)th and (2-2)th data (DATA1-2+DATA2-2) may be stored in the second page PG2, and the (1-3)th and (2-3)th data (DATA1-3+DATA2-3) may be stored in the third page PG3.

Figure 12:
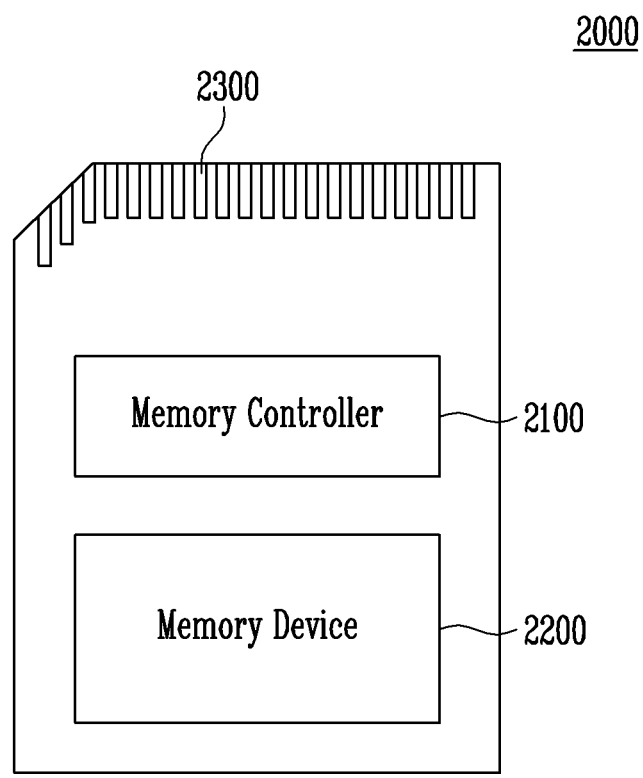
FIG. 12 is a diagram illustrating a memory card system to which the memory controller of the present disclosure is applied.

FIG. 12 is a diagram illustrating a memory card system to which the memory controller of the present disclosure is applied.

Referring to FIG. 12, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control a program, read or erase operation of the memory device 2200, or control a background operation of the memory device 2200. The memory controller 2100 provides an interface between the memory device 2200 and a host Host. The memory controller 2100 drives firmware for controlling the memory device 2200. The memory controller 2100 shown in FIG. 12 may include the units 51 to 56 shown in the memory controller 1200 shown in FIG. 5, and the memory device 2200 may be configured identically to the memory device MD shown in FIG. 2.

The memory controller 2100 may communicate with an external device through the connector 2300. The memory controller 2100 may communicate with the external device (e.g., the host) according to a specific communication protocol. The memory controller 2100 may communicate with the external device through at least one of various communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be defined by at least one of the above-described various communication standards or interfaces.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 13:
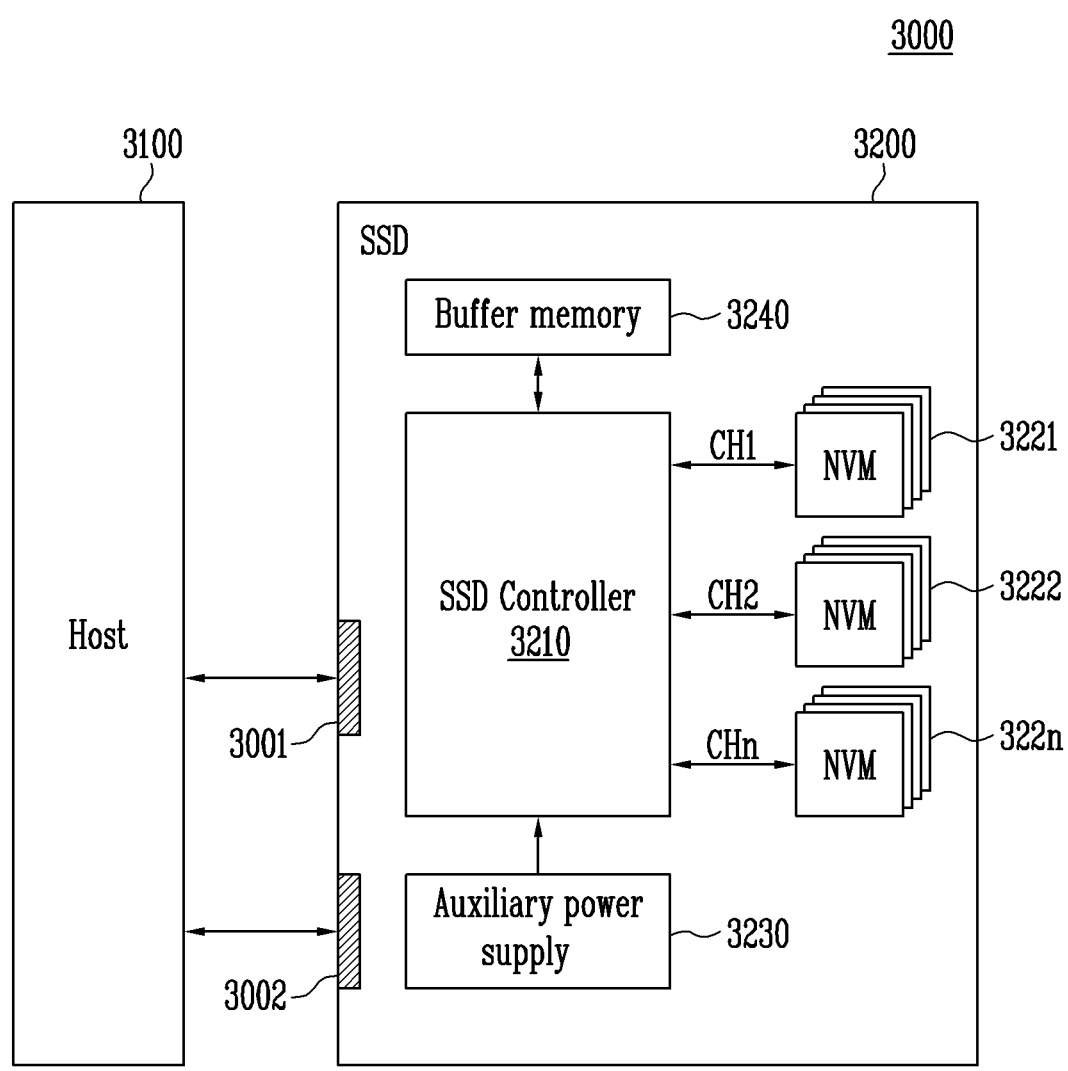
FIG. 13 is a diagram illustrating a Solid State Drive (SDD) to which the memory controller of the present disclosure is applied.

FIG. 13 is a diagram illustrating a Solid State Drive (SDD) to which the memory controller of the present disclosure is applied.

Referring to FIG. 13, the SSD system 3000 includes a host 3100 and an SSD 3200. The SSD 3200 exchanges a signal with the host 3100 through a signal connector 3001, and receives a power voltage through a power connector 3002. The SSD 3200 includes an SSD controller 3210, a plurality of flash memories 3221 to 322n, an auxiliary power supply 3230, and a buffer memory 3240.

The flash memories 3221 to 322n shown in FIG. 13 may be configured identically to the memory device MD shown in FIG. 2. The SSD controller 3210 shown in FIG. 13 may include the units 51 to 56 shown in the memory controller 1200 shown in FIG. 5.

The SSD controller 3210 may control the plurality of flash memories 3221 to 322n in response to a signal received from the host 3100. The signal may be a signal based on an interface between the host 3100 and the SSD 3200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power input from the host 3100, and charge the power. When the supply of power from the host 3100 is not smooth, the auxiliary power supply 3230 may provide power of the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, a logical address and a buffer can be efficiently managed, when a migration operation is performed.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

What is claimed is:

1. A memory system comprising:
   a first sub-buffer configured to store an address map table in which logical addresses associated with program requests received from a host and physical addresses used in the memory system are mapped to each other;
   a second sub-buffer configured to sequentially store the logical addresses received from the host and store a latest received logical address in a specific region;
   a third sub-buffer including write buffers each configured to store a size of data corresponding to one of the logical addresses;
   a storage device comprising a plurality of memory blocks, each of the plurality of memory blocks comprising a plurality of memory cells;
   a processor configured to control the storage device to store the data in memory blocks corresponding to the physical addresses respectively mapped to the logical addresses using a single level cell (SLC) method; and
   an address manager configured to select at least two logical addresses for a migration operation from among the logical addresses stored in the second sub-buffer, the at least two logical addresses including the latest received logical address stored in the specific region of the second sub-buffer,
   wherein the processor is configured to control the storage device to store data read from memory blocks corresponding to the at least two logical addresses in a memory block using a multi level cell (MLC) method, and
   wherein the address manager is configured to release a write buffer corresponding to the latest received logical address from among the write buffers.

2. The memory system of claim 1, wherein the second sub-buffer includes a plurality of regions configured to store the logical addresses.

3. The memory system of claim 2, wherein any one region among the plurality of regions is designated as the specific region.

4. The memory system of claim 3, wherein the address manager is further configured to store a logical address previously stored in the specific region to another region included in the second sub-buffer, before the latest logical address is stored in the specific region.

5. A memory system comprising:
   a storage device including a plurality of memory blocks; and
   a memory controller configured to control the storage device such that data is programmed in the memory blocks,
   wherein the memory controller includes:
   a central processing unit configured to generate a first program command of a single level cell (SLC) method or a second program command of a multi-level cell (MLC)-or-more method;
   a buffer configured to store logical addresses, physical addresses, and a size of data corresponding to each of the logical addresses; and
   an address manager configured to:
   store, in a specific region included in the buffer, a latest received logical address among logical addresses received from a host whenever the first program command is generated,
   select the latest logical address stored in the specific region when the second program command is generated, and
   release a write buffer in which the size of the data corresponding to the latest logical address is stored, the write buffer being included in the buffer.

6. The memory system of claim 5, wherein the buffer includes:
   a first sub-buffer configured to store an address map table in which the logical address and the physical address are mapped to each other;
   a second sub-buffer including a plurality of regions in which the logical addresses are sequentially stored, the second sub-buffer storing the latest received logical address in the specific region among the plurality of regions; and
   a third sub-buffer configured to store the size of the data corresponding to each of the logical addresses.

7. The memory system of claim 6, wherein, when a logical address mapped to the physical address is received, the address manager is further configured to store, in the first sub-buffer, the address map table in which the logical address and the physical address are mapped to each other.

8. The memory system of claim 6, wherein, when a new logical address is received in a state in which the logical address is previously stored in the specific region, the address manager is further configured to move the logical address previously stored in the specific region to another region, and store the new logical address in the specific region.

9. The memory system of claim 6, wherein the address manager is further configured to store the size of the data corresponding to each of the logical addresses in write buffers included in the third buffer.

10. The memory system of claim 6, wherein, when the second program command is completed, the address manager releases the write buffer corresponding to the logical address stored in the specific region.

11. The memory system of claim 5, wherein the storage device is configured to perform a program operation to store the data in memory blocks selected according to physical addresses mapped to the logical addresses by using the SLC method, in response to the first program command.

12. The memory system of claim 11, wherein the storage device is configured to migrate the data, which is stored in the memory blocks by using the SLC method, to a selected memory block by using the MLC-or-more method, in response to the second program command.

13. The memory system of claim 12, wherein the storage device is configured to:
read the memory blocks in which the data is programmed by using the SLC method; and
program the read data in the selected memory block by using the MLC-or-more method.

14. The memory system of claim 13, wherein the storage device is configured to read the memory blocks in which the data is programmed by using the SLC method, and erase the memory blocks.

15. The memory system of claim 5,
wherein the SLC method is a method in which 1-bit data is stored in one memory cell, and
wherein the MLC-or-more method is a method in which two-or-more-bit data is stored in the one memory cell.

16. The memory system of claim 5, wherein the MLC-or-more method includes the MLC method, a triple level cell (TLC) method, or a quadruple level cell (QLC) method.

17. The memory system of claim 16,
wherein the TLC method is a method in which 3-bit data is stored in one memory cell, and
wherein the QLC method is a method in which 4-bit data is stored in the one memory cell.

18. A method for operating a memory system, the method comprising:
storing a first logical address mapped to a first physical address in a specific region included in a buffer according to a first program request of a host;
storing a size of data corresponding to the first logical address in a first write buffer included in the buffer;
performing a program operation to store the data in first memory blocks corresponding to the first physical address by using a single level cell (SLC) method;
storing a second logical address mapped to a second physical address in the specific region included in the buffer according to a second program request of the host;
storing a size of data corresponding to the second logical address in a second write buffer included in the buffer;
performing a program operation to store the data in second memory blocks corresponding to the second physical address by using the SLC method;
when any request of the host does not exist during a preset time, selecting the second logical address stored in the specific region, and performing a program operation to store the data read from the second memory blocks corresponding to the selected second logical address in the first memory blocks by using a multi level cell (MLC) method; and
releasing the second write buffer corresponding to the second logical address.

19. The method of claim 18, further comprising moving the first logical address stored in the specific region to another region included in the buffer, before the writing of the second logical address in the specific region included in the buffer.

20. The method of claim 18, wherein the releasing of the second write buffer includes storing the first logical address and the second logical address in the first write buffer and erasing the second write buffer.

* * * * *